US010340363B2

(12) United States Patent
Lee et al.

(10) Patent No.: US 10,340,363 B2
(45) Date of Patent: Jul. 2, 2019

(54) FABRICATION OF VERTICAL FIELD EFFECT TRANSISTORS WITH SELF-ALIGNED BOTTOM INSULATING SPACERS

(71) Applicant: International Business Machines Corporation, Armonk, NY (US)

(72) Inventors: Choonghyun Lee, Rensselaer, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/804,303

(22) Filed: Nov. 6, 2017

(65) Prior Publication Data

US 2019/0140080 A1   May 9, 2019

(51) Int. Cl.
| H01L 29/08 | (2006.01) |
| H01L 29/66 | (2006.01) |
| H01L 29/78 | (2006.01) |
| H01L 29/417 | (2006.01) |
| H01L 21/8234 | (2006.01) |

(52) U.S. Cl.
CPC ........ *H01L 29/66666* (2013.01); *H01L 21/823418* (2013.01); *H01L 29/0847* (2013.01); *H01L 29/41741* (2013.01); *H01L 29/41783* (2013.01); *H01L 29/7827* (2013.01)

(58) Field of Classification Search
CPC ....... H01L 2029/7858; H01L 29/66666; H01L 29/41783; H01L 29/0847; H01L 21/823418; H01L 29/41741; H01L 29/7827
See application file for complete search history.

(56) References Cited

U.S. PATENT DOCUMENTS

| 6,222,788 B1 * | 4/2001 | Forbes ..................... G11C 8/10 257/302 |
| 6,413,802 B1 * | 7/2002 | Hu ......................... H01L 21/845 438/151 |
| 8,138,039 B2 | 3/2012 | Tang et al. |
| 8,883,596 B2 | 11/2014 | Cheong et al. |

(Continued)

*Primary Examiner* — Edward Chin
(74) *Attorney, Agent, or Firm* — Vazken Alexanian; Ryan, Mason & Lewis, LLP

(57) ABSTRACT

A vertical field-effect transistor (FET) device is fabricated with a self-aligned bottom insulating spacer for improved electrostatic control. A semiconductor fin is formed on a semiconductor substrate. A lower source/drain region, which is formed of a first type of epitaxial semiconductor material, is epitaxially grown on a surface of the substrate in contact with a bottom portion of the semiconductor fin. A sacrificial epitaxial semiconductor layer is epitaxially grown on top of the lower source/drain region, wherein the sacrificial epitaxial semiconductor layer is formed of a second type of epitaxial semiconductor material which is different from the first type of epitaxial semiconductor material. The sacrificial epitaxial semiconductor layer is selectively oxidized to form a self-aligned bottom insulating spacer comprising an oxide layer. A gate structure is formed contact with sidewalls of the semiconductor fin. The self-aligned bottom insulating spacer electrically insulates the gate structure from the lower source/drain region.

20 Claims, 9 Drawing Sheets

(56) References Cited

U.S. PATENT DOCUMENTS

| | | | |
|---|---|---|---|
| 9,257,527 B2* | 2/2016 | Hashemi | H01L 29/42392 |
| 9,368,572 B1 | 6/2016 | Cheng et al. | |
| 9,431,306 B2* | 8/2016 | Jacob | H01L 21/845 |
| 9,443,982 B1 | 9/2016 | Balakrishnan et al. | |
| 9,711,414 B2* | 7/2017 | Hatcher | H01L 21/823807 |
| 10,038,094 B2* | 7/2018 | Fung | H01L 21/02532 |
| 2013/0270512 A1* | 10/2013 | Radosavljevic | H01L 21/823821 257/9 |
| 2015/0357432 A1* | 12/2015 | Lin | H01L 29/66439 257/24 |

* cited by examiner

US 10,340,363 B2

FABRICATION OF VERTICAL FIELD EFFECT TRANSISTORS WITH SELF-ALIGNED BOTTOM INSULATING SPACERS

TECHNICAL FIELD

This disclosure relates generally to semiconductor fabrication techniques and, in particular, to structures and methods for fabricating vertical field effect transistor (FET) devices.

BACKGROUND

Traditional CMOS (complementary metal oxide semiconductor) techniques include process flows for constructing planar FET devices. With planar FETs, increased transistor density can be achieved by decreasing the pitch between transistor gate elements. However, with planar FET devices, the ability to decrease gate pitch is limited by the required gate length and spacer thickness. In recent years, there has been significant research and development with regard to vertical FET devices, which decouple the gate length from the gate pitch requirement and enable scaling of transistor density. In general, vertical FET devices are designed to have gate structures that are formed on multiple sides of a vertical channel structure (e.g., a vertical semiconductor fin or vertical nanowire). In addition, vertical FET devices employ doped source and drain regions, wherein a doped source region can be formed on top of a vertical semiconductor fin, and wherein a doped drain region can be formed underneath the vertical semiconductor fin. With vertical FET devices, scaling is determined by how close vertical conductive contacts to the source and drain regions can be placed.

One challenge with vertical FET fabrication involves the formation of bottom insulating spacers to insulate the lower source/drain regions from the gate structures. For example, some fabrication techniques involve depositing a layer of insulating material (e.g., oxide material) to cover the lower source/drain regions, followed by an etch-back process to remove the excess insulating material and form the bottom insulating spacers. The etch-back process typically results in the formation of a meniscus-shaped (curve-shaped) upper surface of the bottom insulating spacer, wherein end portions of the bottom insulating spacer, which are adjacent to and in contact with sidewalls of vertical semiconductor fins, curve slightly upward along the sidewalls of the vertical semiconductor fins. The curved upper surfaces of the bottom insulating spacers against the lower sidewalls of vertical semiconductor fins results in insulating material being disposed between a lower portion of a gate structure and the semiconductor fin, which undesirably reduces the gate length and, consequently, leads to issues of gate controllability. Furthermore, the etch-back process can result in over etching of the thickness of the bottom insulating spacer, resulting in thinner than expected bottom insulating spacers, which increases the parasitic capacitance between the lower source/drain regions and the gate structures. These structural anomalies lead to reduced electrostatic control of the operation of the vertical FET devices.

SUMMARY

Embodiments of the invention include semiconductor devices comprising vertical FET devices with self-aligned bottom insulating spacers to provide improved electrostatic control, as well as methods for fabricating vertical FET devices with self-aligned bottom insulating spacers.

For example, one embodiment includes a method for fabricating a semiconductor device, which comprises: forming a semiconductor fin on a surface of a semiconductor substrate; epitaxially growing a lower source/drain region on the surface of the semiconductor substrate in contact with a bottom portion of the semiconductor fin, wherein the lower source/drain region is formed of a first type of epitaxial semiconductor material; epitaxially growing a sacrificial epitaxial semiconductor layer on top of the lower source/drain region, wherein the sacrificial epitaxial semiconductor layer is formed of a second type of epitaxial semiconductor material which is different from the first type of epitaxial semiconductor material; selectively oxidizing the sacrificial epitaxial semiconductor layer to form a self-aligned bottom insulating spacer comprising an oxide layer; and forming a gate structure in contact with sidewalls of the semiconductor fin. The self-aligned bottom insulating spacer electrically insulates the gate structure from the lower source/drain region.

In one embodiment, the first type of epitaxial semiconductor material comprises crystalline silicon, and the second type of epitaxial semiconductor material comprises crystalline silicon germanium. In another embodiment, the first type of epitaxial semiconductor material comprises crystalline silicon germanium with a first concentration of germanium, and the second type of epitaxial semiconductor material comprises crystalline silicon germanium with a second concentration of germanium which is greater than the first concentration of germanium.

Another embodiment includes a method for fabricating a semiconductor device, which comprises: patterning a surface of a semiconductor substrate to form a semiconductor fin; forming sidewall spacers on sidewalls of the semiconductor fin; recessing the surface of the semiconductor substrate to a target depth below a bottom level of the sidewall spacers to form an extended bottom portion of the semiconductor fin; laterally etching exposed sidewalls of the extended bottom portion of the semiconductor fin to reduce a width of the extended bottom portion of the semiconductor fin; epitaxially growing a lower source/drain region on the recessed surface of the semiconductor substrate in contact with the extended bottom portion of the semiconductor fin, wherein the lower source/drain region is formed of a first type of epitaxial semiconductor material; epitaxially growing a sacrificial epitaxial semiconductor layer on top of the lower source/drain region, wherein the sacrificial epitaxial semiconductor layer is formed of a second type of epitaxial semiconductor material which is different from the first type of epitaxial semiconductor material; selectively oxidizing the sacrificial epitaxial semiconductor layer to form a self-aligned bottom insulating spacer comprising an oxide layer; removing the sidewall spacers from the sidewalls of the semiconductor fin; and forming a gate structure in contact with the sidewalls of the semiconductor fin; wherein the self-aligned bottom insulating spacer electrically insulates the gate structure from the lower source/drain region.

Another embodiment includes a semiconductor device comprising a vertical FET device formed on a semiconductor substrate. The vertical FET device comprises: a semiconductor fin formed on a recessed surface of a semiconductor substrate; a lower source/drain region formed on the recessed surface of the semiconductor substrate in contact with a bottom portion of the semiconductor fin, wherein the lower source/drain region comprises a first type of epitaxial semiconductor material; a self-aligned bottom insulating spacer formed on the lower source/drain region, the self-aligned bottom insulating spacer comprising an oxide layer formed from oxidation of a second type of epitaxial semiconductor material epitaxially grown on the lower source/drain region, which is different from the first type of epitaxial semiconductor material; a gate structure formed in contact with sidewalls of the semiconductor fin; an upper insulating spacer formed on the gate structure; and an upper source/drain region formed on an upper portion of the semiconductor fin. The self-aligned bottom insulating spacer electrically insulates the lower source/drain region from the gate structure, the upper insulating spacer electrically insulates the upper source/drain region from the gate structure.

Other embodiments will be described in the following detailed description of embodiments, which is to be read in conjunction with the accompanying figures.

BRIEF DESCRIPTION OF THE DRAWINGS

FIGS. 2 through 14 schematically illustrate a method for fabricating the semiconductor device of FIG. 1 according to an embodiment of the invention, wherein:

FIG. 2 is a schematic cross-sectional side view of the semiconductor device at an intermediate stage of fabrication in which a hardmask layer is formed on a semiconductor substrate;

FIG. 3 is a schematic cross-sectional side view of the semiconductor structure of FIG. 2 after patterning the hardmask layer to form an etch hardmask having an image that defines vertical semiconductor fins to be formed in an upper surface of the semiconductor substrate;

FIG. 4 is a schematic cross-sectional side view of the semiconductor structure of FIG. 3 after etching the semiconductor substrate down to a target depth D to form a plurality of vertical semiconductor fins defined by the image of the etch hard mask;

FIG. 5 is a schematic cross-sectional side view of the semiconductor structure of FIG. 4 after forming a conformal layer of insulating material on the surface of the semiconductor structure to cover the vertical semiconductor fins;

FIG. 6 is a schematic cross-sectional side view of the semiconductor structure of FIG. 5 after etching the conformal layer of insulating material to form sidewall spacers on sidewalls of the vertical semiconductor fins;

FIG. 7 is a schematic cross-sectional side view of the semiconductor structure of FIG. 6 after recessing the surface of the semiconductor substrate down to a target depth D1 below a bottom level of the sidewall spacers;

FIG. 8 is a schematic cross-sectional side view of the semiconductor structure of FIG. 7 after performing a lateral etch process to laterally etch exposed bottom portions of the vertical semiconductor fins to a target lateral recess depth DL;

FIG. 9 is a schematic cross-sectional side view of the semiconductor structure of FIG. 8 after forming lower source/drain regions on exposed portions of the semiconductor substrate adjacent to the bottom portions of the vertical semiconductor fins;

FIG. 10 is a schematic cross-sectional side view of the semiconductor structure of FIG. 9 after forming sacrificial epitaxial semiconductor layers on top of the lower source/drain regions;

FIG. 11 is a schematic cross-sectional side view of the semiconductor structure of FIG. 10 showing an oxidation process that is performed to oxidize the sacrificial epitaxial semiconductor layers and form self-aligned bottom insulating spacers;

FIG. 12 is a schematic cross-sectional side view of the semiconductor structure of FIG. 11 after removing the sidewall spacers from the vertical semiconductor fins;

FIG. 13 is a schematic cross-sectional side view of the semiconductor structure of FIG. 12 after forming gate structures, upper insulating spacers, and a pre-metal dielectric layer; and FIG. 14 is a schematic cross-sectional side view of the semiconductor structure of FIG. 13 after forming upper source/drain regions, an interlevel dielectric layer, vertical source/drain contacts, and a contact opening for a vertical source source/drain contact to a lower source/drain region.

FIGS. 15 and 16 schematically illustrate a process flow for fabricating self-aligned bottom insulating spacers for vertical FET devices according to another embodiment of the invention, wherein:

FIG. 15 is a schematic cross-sectional side view of the semiconductor structure of FIG. 9 after forming sacrificial epitaxial semiconductor layers on top of the lower source/drain regions; and FIG. 16 is a schematic cross-sectional side view of the semiconductor structure of FIG. 15 showing an oxidation process that is performed to oxidize the sacrificial epitaxial semiconductor layers and form self-aligned bottom insulating spacers.

DETAILED DESCRIPTION

Figure 1:
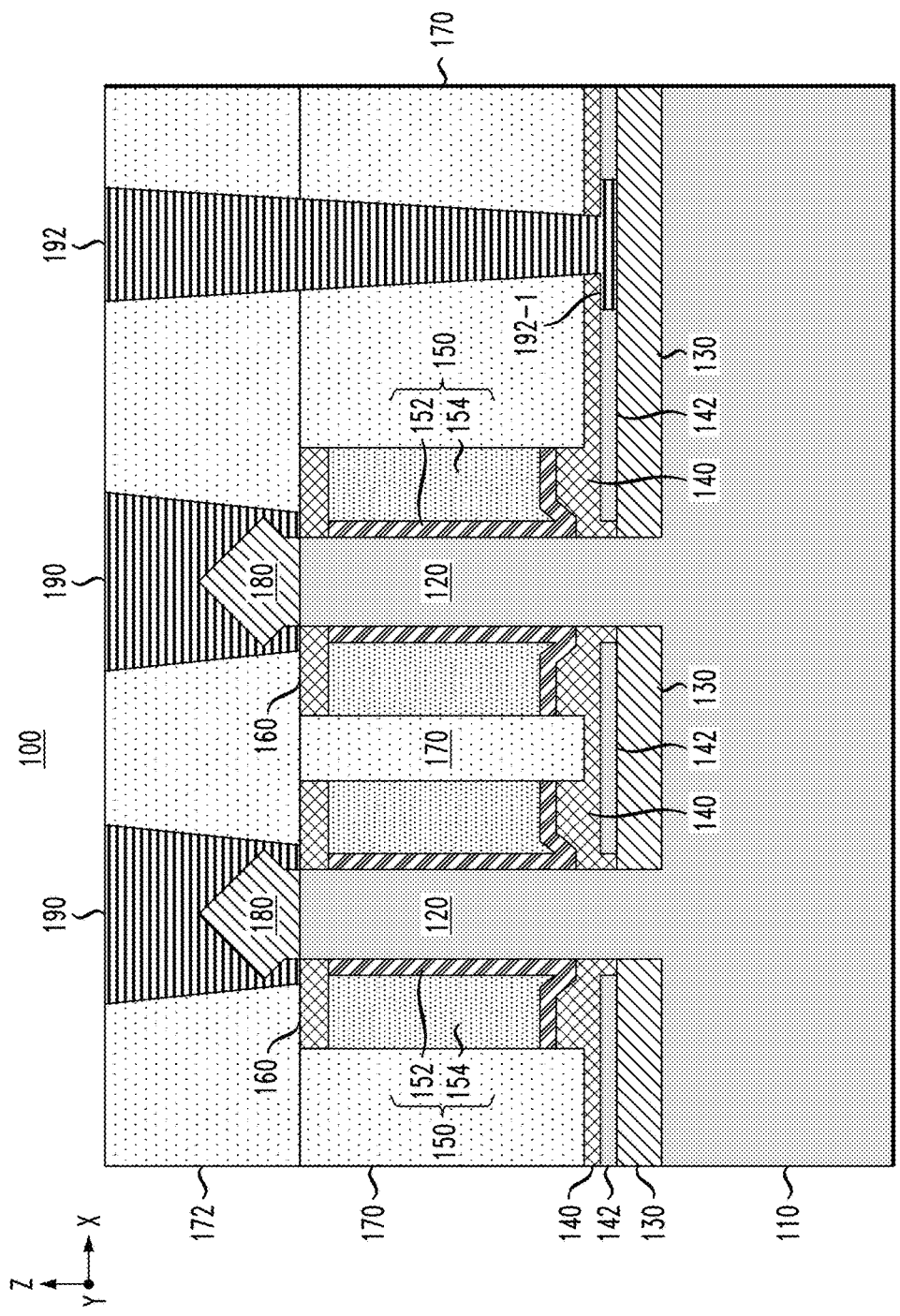
FIG. 1 is a schematic cross-sectional side view of a semiconductor device comprising vertical FET devices with self-aligned bottom insulating spacers, according to an embodiment of the invention.

Embodiments will now be described in further detail with regard to semiconductor devices comprising vertical FET devices with self-aligned bottom insulating spacers to provide improved electrostatic control, as well as methods for fabricating vertical FET devices with self-aligned bottom insulating spacers. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the term "vertical" or "vertical direction" or "vertical height" as used herein denotes a Z-direction of Cartesian coordinates shown in the drawings, and the terms "horizontal," or "horizontal direction," or "lateral direction" as used herein denotes an X-direction and/or Y-direction of the Cartesian coordinates shown in the drawings.

FIG. 1 is a schematic cross-sectional side view of a semiconductor device 100 comprising vertical FET devices with self-aligned bottom insulating spacers, according to an embodiment of the invention. The semiconductor device 100 comprises a semiconductor substrate 110, a plurality of vertical semiconductor fins 120, lower source/drain regions 130, self-aligned bottom insulating spacers 140, high-concentration germanium semiconductor layers 142, gate structures 150, upper spacers 160, a pre-metal dielectric (PMD) layer 170, upper source/drain regions 180, an interlevel dielectric (ILD) layer 172, and a plurality of vertical source/drain contacts 190 and 192. The gate structures 150 comprise thin gate dielectric layers 152 disposed on sidewalls of the vertical semiconductor fins 120, and gate electrode layers 154 comprising conductive material. The gate structures 150 are formed around respective vertical semiconductor fins 120. It is to be understood that the term "source/drain region" as used herein means that a given source/drain region can be either a source region or a drain region, depending on the application or circuit configuration.

It is to be understood that FIG. 1 illustrates two vertical semiconductor fins 120 for ease of illustration and explanation. The vertical semiconductor fins 120 may comprise two channel segments which are connected in parallel to collectively form a single, multi-fin vertical FET device. In particular, the lower source/drain regions 130 may be formed to surround the semiconductor fins 120 and provide a common lower source/drain region for the vertical semiconductor fins 120 which form the single, multi-fin vertical FET device. While FIG. 1 shows one vertical source drain contact 192 to the lower source/drain region 130, a multi-fin vertical FET device may comprise two or more vertical source/drain contacts formed in contact with the lower source/drain region, wherein the two or more vertical source/drain contacts can be formed adjacent to, and along a length of, one or more of the vertical semiconductor fins 120, and/or adjacent to end portions of the vertical semiconductor fins 120. The vertical source/drain contacts to the lower source/drain region 130 can be connected to each other using metallization in an upper layer of a BEOL (back-end-of-line) interconnect structure (not shown), which is formed over the ILD layer 172. Similarly, while FIG. 1 shows separate vertical source/drain contacts 190 connected to the respective upper source/drain regions 180, the vertical source/drain contacts 190 can be connected to each other using metallization in an upper layer of the BEOL interconnect structure which is formed over the ILD layer 172.

In the example embodiment of FIG. 1, the self-aligned bottom insulating spacers 140 serve to electrically insulate the lower source/drain regions 130 from the gate structures 150, and the upper insulating spacers 160 serve to electrically insulate the upper source/drain regions 180 from the gate structures 150. In one embodiment, the gate structures 150 are formed to surround the respective vertical semiconductor fins 120, as is understood by those of ordinary skill in the art. The gate electrode layers 154 of the gate structures 150 can be formed to extend past the ends of the vertical semiconductor fins 120 (in the Y-direction) to provide landing areas on which vertical gate contacts (not shown in FIG. 1) can be formed through the ILD layer 172 to provide contacts to the gate structures 150.

As explained in further detail below, the self-aligned bottom insulating spacers 140 are formed using self-aligned spacer fabrication techniques, which allow for uniformity and control in the coverage of the gate structures 150 over the entire channel length of the vertical semiconductor fins 120, as well as tight control on the target spacer thickness when forming the bottom insulating spacers 140. In general, the self-aligned bottom insulating spacer fabrication methods involve epitaxially growing sacrificial epitaxial semiconductor layers on top of the lower source/drain regions 130, followed by a selective oxidation process to convert the sacrificial epitaxial semiconductor layers to insulating material (e.g., silicon oxide), thereby forming the self-aligned bottom insulating spacers 140. The self-aligned bottom insulating spacers 140 enable improved electrostatic gate control for the vertical FET devices, and well as reduced parasitic capacitance between the gate structures 150 and the lower source/drain regions 130.

In addition, as explained in further detail below, the high-concentration germanium semiconductor layers 142 are formed as a result of the oxidation process that is performed to convert the sacrificial epitaxial semiconductor layers to insulating material. For example, the high-concentration germanium semiconductor layers 142 have a germanium concentration of about 20% or greater. The high-concentration germanium semiconductor layers 142 can be etched highly selective to the materials that form the lower source/drain regions 130 and the self-aligned bottom insulating spacers 140. As such, selective etching methods can be applied to laterally etch a portion of a high-concentration germanium semiconductor layer 142 and form an undercut region 142-1 (FIG. 14), wherein the undercut region 142-1 is filled with a metallic material to form a laterally extended contact element 192-1 at the bottom of vertical source/drain contact 192, as shown in FIG. 1. The laterally extended contact element 192-1 provides a larger contact area between the lower source/drain region 130 and the vertical source/drain contact 192.

Figure 2:
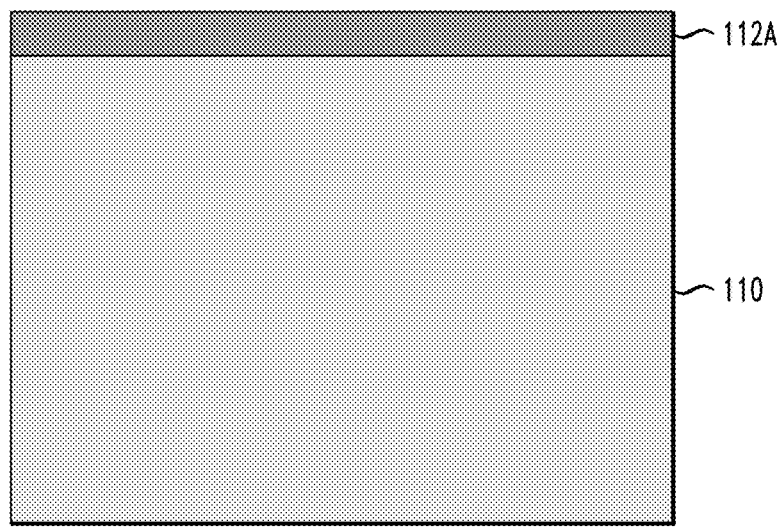

Methods for fabricating the semiconductor device 100 shown in FIG. 1 will now be discussed in further detail with reference to FIG. 2 through FIG. 14, which schematically illustrate the semiconductor device 100 at various stages of fabrication. To begin, FIG. 2 is a schematic cross-sectional side view of the semiconductor device 100 at an intermediate stage of fabrication comprising a semiconductor substrate 110 and a hardmask layer 112A formed on top of the semiconductor substrate 110. The hardmask layer 112A is formed of an insulating material such as silicon nitride. Next, FIG. 3 is a schematic cross-sectional side view of the semiconductor structure of FIG. 2 after patterning the hardmask layer 112A to form an etch hardmask 112 having an image that defines vertical semiconductor fins to be formed the upper surface of the semiconductor substrate 110.

Figure 3:
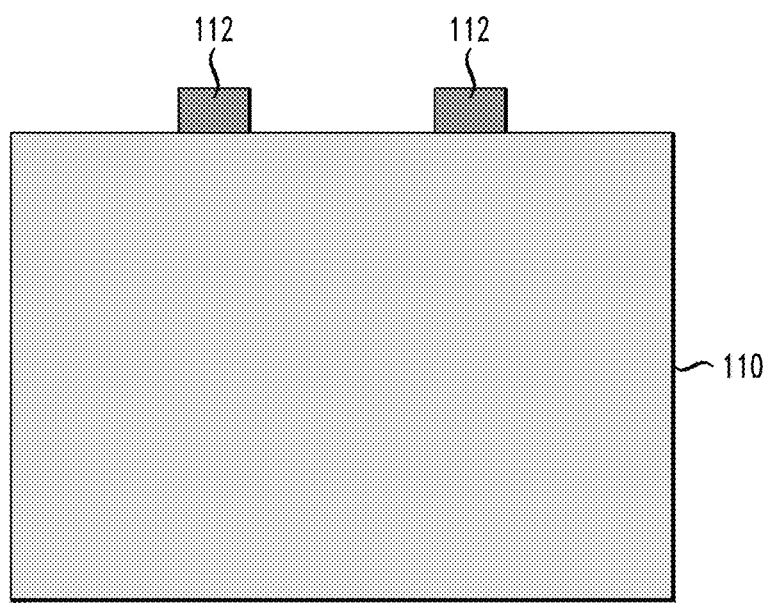

While the semiconductor substrate 110 is generically illustrated in FIGS. 2 and 3, the semiconductor substrate 110 may comprise one of different types of semiconductor substrate structures. In one embodiment, the semiconductor substrate can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a FEOL (front end of line) structure. It is to be noted that in each drawing, the X-Y plane represents a plane that is parallel to the plane of the semiconductor substrate 110 (e.g., wafer) being processed.

The hardmask layer 112A can be patterned using any standard process, e.g., lithography, which involves forming an etch mask (e.g., photoresist mask), followed by a dry etch process (e.g., reactive ion etch (RIE) process) to etch exposed portions of the hardmask layer 112A to form the etch hardmask 112. The etch hardmask 112 can be patterned using techniques including, for example, multi-patterning methods such as sidewall image transfer (SIT), self-aligned double patterning (SADP), and self-aligned quadruple patterning (SAQP) techniques. For example, the etch mask 112 shown in FIG. 3 can be fabricated using a multi-patterning process which comprises (i) depositing a layer of sacrificial material on the hardmask layer 112A, (ii) patterning the layer of sacrificial material to form a pattern of sacrificial mandrel features, (iii) depositing a conformal layer of mask material (e.g., silicon dioxide (SiO2)) over the sacrificial mandrel features, (iv) etching the conformal layer of mask material using an anisotropic etch-back process to form "spacer" features on the sidewalls of the sacrificial mandrel features, (v) etching away the sacrificial mandrel features selective to the spacer features and the hardmask layer 112A to form a semiconductor fin pattern image (defined by the remaining spacer features), and then (vi) patterning the hardmask layer 112A using the semiconductor fin pattern image to form the etch hardmask 112 pattern shown in FIG. 3, which provides an image of semiconductor fins to be etched in the surface of the substrate 110.

Figure 4:
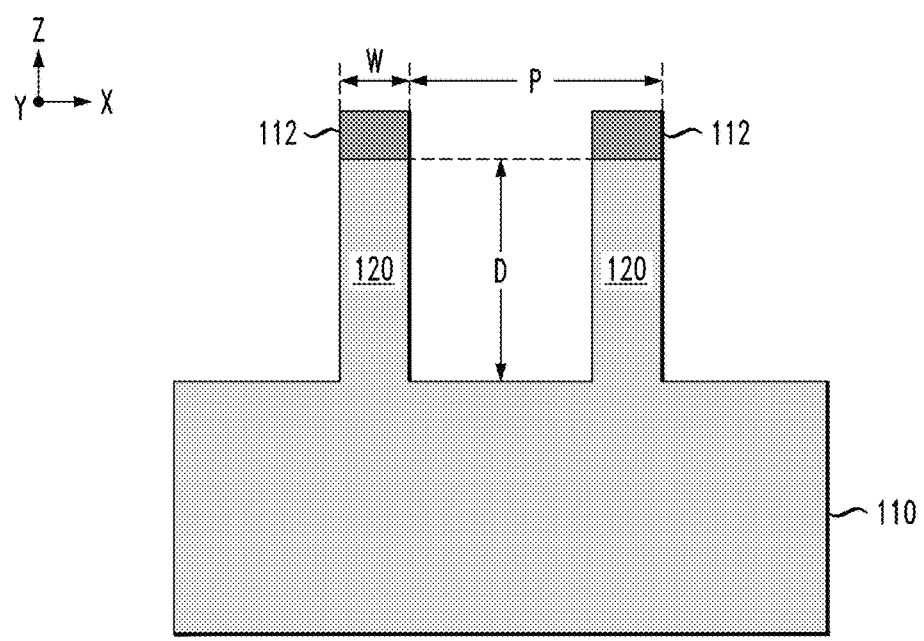

Next, FIG. 4 is a schematic cross-sectional side view of the semiconductor structure of FIG. 3 after etching the semiconductor substrate 110 to form the vertical semiconductor fins 120. The vertical semiconductor fins 120 are formed by recessing the portions of the semiconductor substrate 100, which are exposed through the etch hardmask 112, down to a target depth D, as shown in FIG. 4. The vertical semiconductor fins 120 are formed with an average width W, and are spaced by a pitch P. The vertical semiconductor fins 120 are formed to have target lengths (not shown) which extend in the Y-direction. In one example embodiment, the average width W of the vertical fins 120 is in a range of about 5 nm to about 20 nm, the length of the vertical fins 120 is in a range of about 50 nm to about 1000 nm, and the pitch P of the vertical fins 120 is in a range of about 20 nm to about 100 nm. Further, the initial height (defined by the recess depth D) of the vertical semiconductor fins 120 is in a range of about 30 nm to about 100 nm. The term "average width" refers to the fact that in practice, each semiconductor fin 120 could have a slightly sloped sidewall profile from the top to the bottom of the semiconductor fin. In this regard, the term "average width" of a semiconductor fin denotes a mean width of the semiconductor fin across its vertical height.

Figure 5:
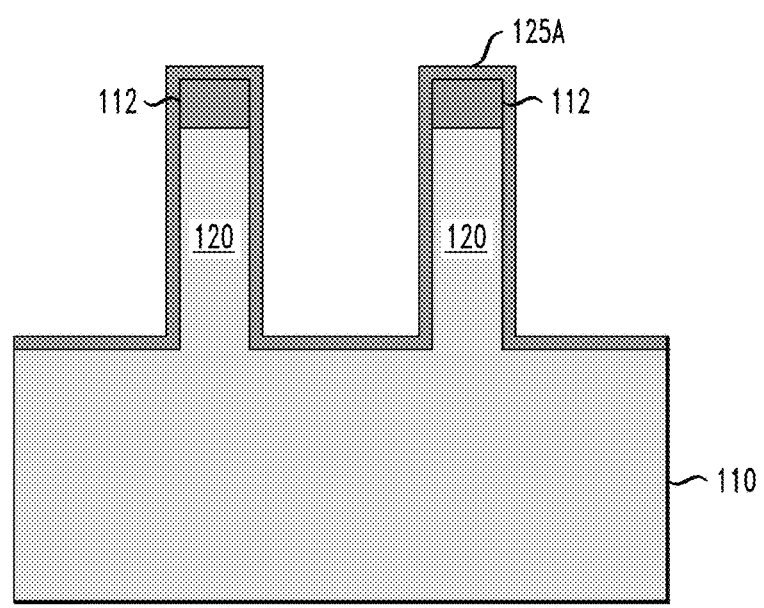
Figure 6:
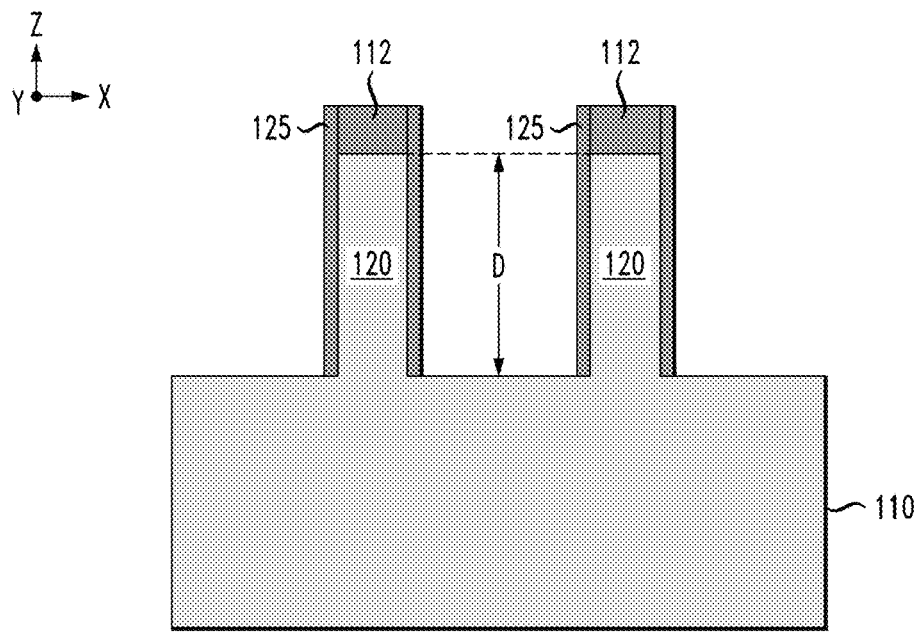

A next stage of the semiconductor fabrication process comprises forming sidewall spacers on the sidewalls of the vertical semiconductor fins 120, as schematically illustrated in FIGS. 5 and 6. In particular, FIG. 5 is a schematic cross-sectional side view of the semiconductor structure of FIG. 4 after forming a conformal layer of insulating material 125A on the surface of the semiconductor structure to cover the vertical semiconductor fins 120, and FIG. 6 is a schematic cross-sectional side view of the semiconductor structure of FIG. 5 after etching the conformal layer of insulating material 125A to form sidewall spacers 125 on the sidewalls of the vertical semiconductor fins 120. In one embodiment, the conformal layer of insulating material 125A is formed of the same or similar type of insulating or dielectric material as the etch hardmask 112 (e.g., SiN).

The conformal layer of insulating material 125 is deposited using any suitable deposition method which provides sufficient conformality, such as atomic layer deposition (ALD). The conformal layer of insulating material 125A is formed with a thickness in a range of about 3 nm to about 5 nm. The sidewall spacers 125 can be formed by etching the conformal layer of insulating material 125A using a directional anisotropic dry etch process, which is configured to etch away lateral portions of the conformal layer of insulating material 125A. The etch process results in the formation of the sidewall spacers 125 shown in FIG. 6 (which have a thickness in a range of about 3 nm to about 5 nm).

Figure 7:
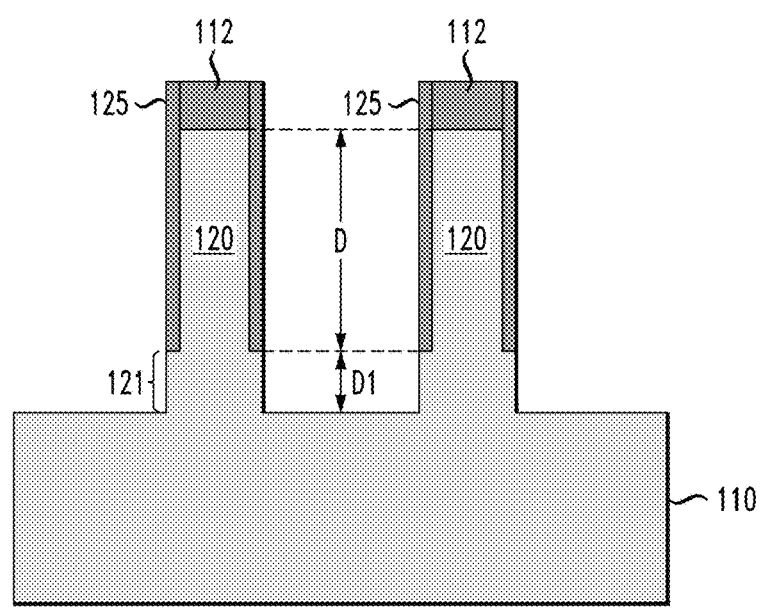
Figure 8:
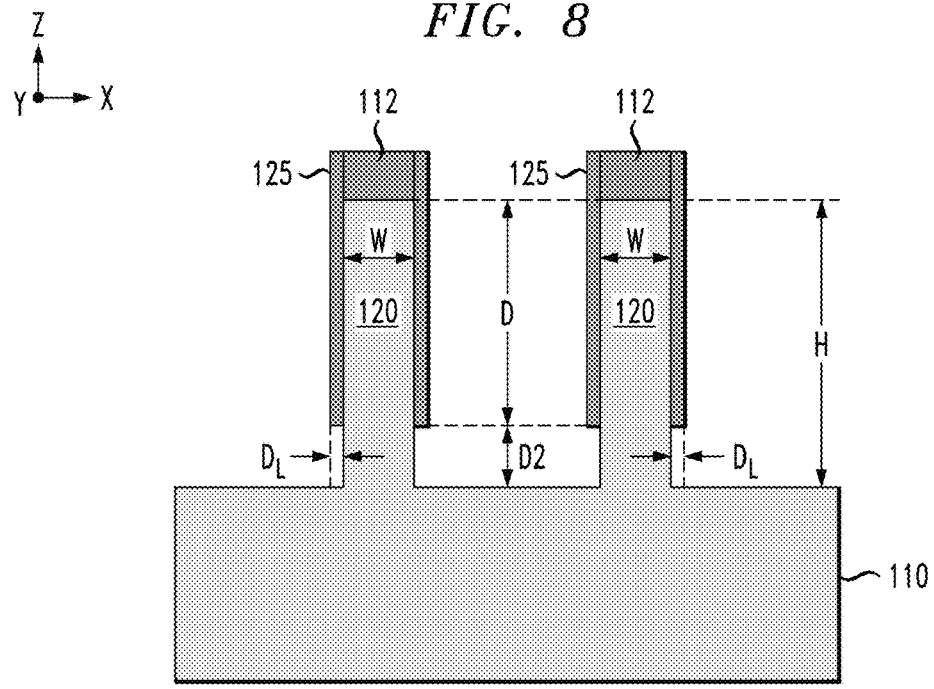
Figure 9:
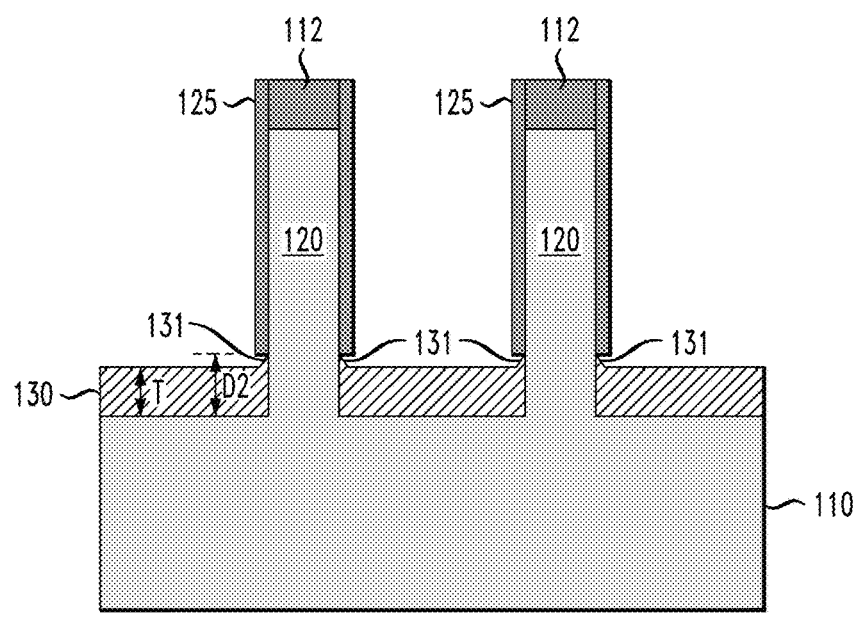

A next stage of the semiconductor fabrication process comprises forming the lower source/drain regions 130 using a process flow as schematically illustrated in FIGS. 7-9. As an initial step, FIG. 7 is a schematic cross-sectional side view of the semiconductor structure of FIG. 6 after recessing the surface of the semiconductor substrate 110 down to a target depth below a bottom level of the spacers 125. In one embodiment, the recess process is performed using a directional anisotropic dry etch process, which is configured to vertically etch the exposed surface of the semiconductor substrate 110 selective to the materials of the etch hardmask 112 and the sidewall spacers 125. The surface of the semiconductor substrate 110 is further recessed to a depth D1, wherein in one embodiment, the depth D1 is in a range of about 30 nm to about 50 nm below a bottom level of the sidewall spacers 125. The recess process shown in FIG. 7 results in the formation of an extended bottom portion 121 of the semiconductor fins 120, which increases the height of vertical semiconductor fins 120 (i.e., the initial height D of vertical semiconductor fins 120 is increased by D1).

Next, FIG. 8 is a schematic cross-sectional side view of the semiconductor structure of FIG. 7 after performing a lateral etch process to laterally etch exposed bottom portions 121 of the vertical semiconductor fins 120 to a target lateral recess depth DL. In one embodiment, the exposed sidewalls of the extended bottom portions 121 of the semiconductor fins 120 are laterally etched to reduce the width of the bottom portions 121 of vertical semiconductor fins 120 to be substantially equal to the (average) width W of the upper portion of the vertical semiconductor fins 120. In this regard, in one embodiment, the lateral recess depth DL is performed to a depth which is substantially equal to a thickness of the sidewall spacers 125.

The lateral recess process of FIG. 8 can be performed using an isotropic dry etch or wet etch process, having an etch chemistry which is configured to etch the semiconductor material (e.g., Si) of the semiconductor substrate 110 selective to the insulating materials (e.g., SiN) of the etch hardmask 112 and the sidewall spacers 125. The isotropic etch process further results in a slight recessing of the lateral surfaces of the semiconductor substrate 110 so that a resulting recess depth D2 as shown in FIG. 8 is slightly greater than the recess depth D1 shown in FIG. 7. As a result of the semiconductor recess steps of FIGS. 7 and 8, vertical semiconductor fins 120 shown in FIG. 9 have a resulting height H equal to D+D2.

Next, FIG. 9 is a schematic cross-sectional side view of the semiconductor structure of FIG. 8 after forming the lower source/drain regions 130 on exposed portions of the semiconductor substrate 110 adjacent to the bottom portions of the vertical semiconductor fins 120. In one embodiment, the lower source/drain regions 130 comprise crystalline semiconductor material which is epitaxially grown using a bottom-up epitaxial growth process in which epitaxial growth of crystalline semiconductor material starts on the exposed lateral recessed surfaces of the semiconductor substrate 110, and continues upward until a target thickness T is reached. In one embodiment, the thickness T of the lower source/drain regions 130 is in a range of about 20 nm to about 30 nm, which is less than the recess depth D2.

With the bottom-up growth process, the epitaxial growth rate on the lateral surfaces of the semiconductor substrate 110 is greater than the growth rate on the vertical sidewalls of the bottom portions of the vertical semiconductor fins 120. In this regard, there can be a small amount of epitaxial material 131 formed on the sidewalls of the vertical semiconductor fins 120 just below the spacers 125, as shown in FIG. 9. In particular, as shown in FIG. 9, the extra epitaxial material 131 essentially results in a thicker profile of the lower source/drain regions 130 adjacent to the bottom portions of the vertical semiconductor fins 120. However, as explained in further detail below, the extra epitaxial material 131 is oxidized during a subsequent process in which the self-aligned bottom insulating spacers 140 are formed.

The lower source/drain regions 130 are formed with an epitaxial semiconductor material that is suitable for the given type of vertical FET devices that are to be formed in the device region shown in the drawings. For example, for n-type vertical FETs, the lower source/drain regions 130 can be formed with crystalline Si, and for p-type vertical FETs, the lower source/drain regions 130 can be formed with crystalline SiGe (e.g., with a Ge concentration of about 40%). The lower source/drain regions 130 can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques. The epitaxial growth is performed selectively so that epitaxial semiconductor material is not formed on the exposed surfaces of sidewall spacers 125 and the etch hardmask 112.

In some embodiments, the lower source/drain regions 130 comprise doped epitaxial semiconductor material. The lower source/drain regions 130 can be doped using known techniques. For example, in one embodiment, the lower source/drain regions 130 can be in-situ doped wherein dopants are incorporated into epitaxial material during the epitaxial growth of the lower source/drain regions 130 using a dopant gas such as, for example, a boron-containing gas such as $BH_3$ for pFETs or a phosphorus or arsenic containing gas such as $PH_3$ or $AsH_3$ for nFETs. In another embodiment, dopants can be incorporated in the lower source/drain regions 130 after the epitaxy process using doping techniques such as ion implantation.

Figure 10:
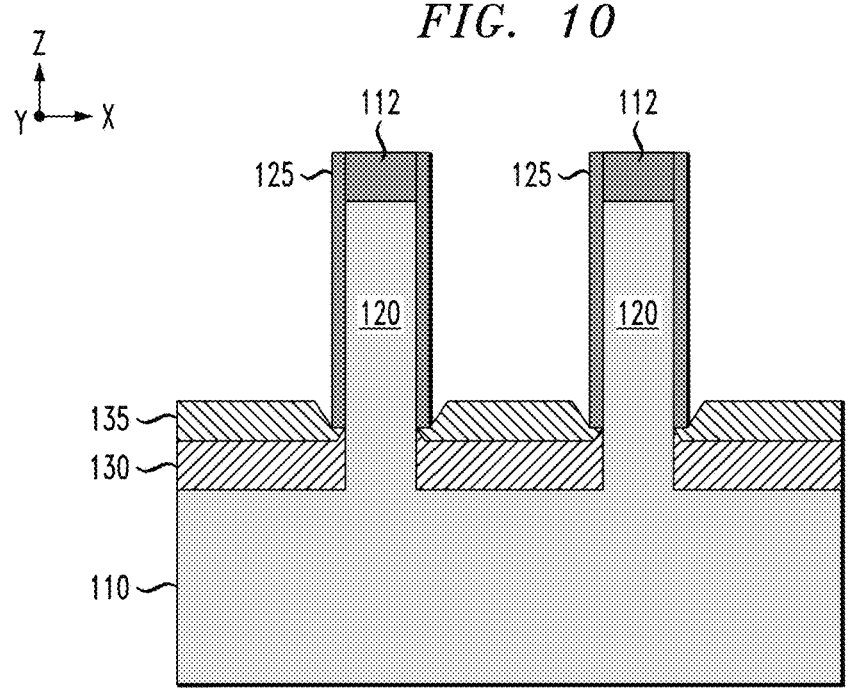
Figure 11:
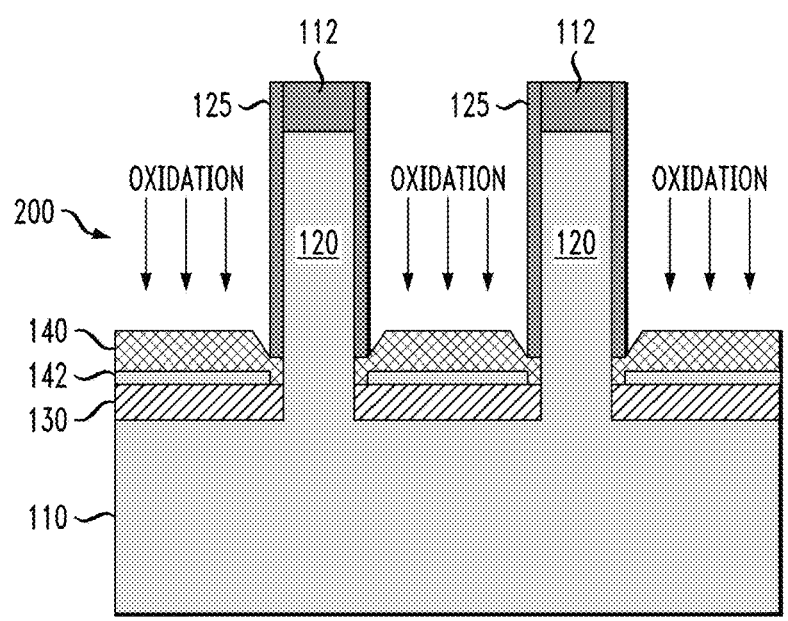

Next, the self-aligned bottom insulating spacers 140 are formed using a process which is schematically illustrated in FIGS. 10 and 11. In particular, FIG. 10 is a schematic cross-sectional side view of the semiconductor structure of FIG. 9 after forming sacrificial epitaxial semiconductor layers 135 on top of the lower source/drain regions 130, and FIG. 11 is a schematic cross-sectional side view of the semiconductor structure of FIG. 10 showing an oxidation process 200 that is performed to oxidize the sacrificial epitaxial semiconductor layers 135 and form the self-aligned bottom insulating spacers 140. In one embodiment of the invention, the sacrificial epitaxial semiconductor layers 135 are formed by growing epitaxial SiGe semiconductor material on top of the lower source/drain regions 130. The sacrificial SiGe semiconductor material is then selectively oxidized to convert the sacrificial epitaxial semiconductor layers 135 into silicon oxide (SiO2) layers, resulting in the formation of the self-aligned bottom insulating spacers 140.

In one embodiment, the epitaxial SiGe material of the sacrificial epitaxial semiconductor layers 135 comprises a Ge concentration which is higher than a Ge concentration of the epitaxial material of the lower source/drain regions 130. For example, in embodiments where the lower source/drain regions 130 are formed of crystalline Si (with no Ge), the sacrificial SiGe layer 135 can be formed with a Ge concentration in a range of about 10% to about 70%. In embodiments where the lower source/drain regions 130 are formed of crystalline SiGe with a given Ge concentration of X %, the sacrificial SiGe layer 135 can be formed with a Ge concentration in a range of about X+10% to about X+70%. The higher Ge concentration of the sacrificial epitaxial semiconductor layer 135 facilitates oxidation of the sacrificial SiGe layer 135 at a rate which is significantly greater than an oxidation rate of pure Si epitaxial material or a SiGe epitaxial material with a lower Ge concentration.

The oxidation process 200 shown in FIG. 11 can be performed using a selective SiGe oxidation process to oxidize the epitaxial semiconductor material of the sacrificial epitaxial semiconductor layers 135 highly selective to the semiconductor materials of the lower source/drain regions 130 and the lower portions of vertical semiconductor fins 120 which are disposed adjacent to the layers 130 and 135. For example, the selective oxidation process 200 can be performed using a radical oxidation process, a plasma oxidation process, a low temperature thermal oxidation process, or any other similar or suitable type of selective oxidation process which is configured to oxidize the sacrificial epitaxial semiconductor layers 135 selective to the other semiconductor materials.

As shown in FIG. 11, the selective oxidation process results in the formation of high-concentration germanium semiconductor layers 142 between the bottom insulating spacers 140 and the lower source/drain regions 130. The high-concentration germanium semiconductor layers 142 are formed as a result of the selective oxidation process in which the Ge atoms of the sacrificial layers 135 are essentially "snow-plowed" toward the interface between the SiGe sacrificial layers 135 and the lower source/drain regions 130 as the SiGe sacrificial layers 135 are oxidized and converted to SiO2. In some embodiments, the high-concentration germanium semiconductor layers 142 are formed within the upper surface regions of the lower source/drain regions 130, wherein Ge atoms from the sacrificial epitaxial semiconductor layers 135 are injected into the upper surfaces of the lower source/drain regions 130.

As further shown in FIG. 11, the extra epitaxial material 131 (as shown in FIG. 9) is oxidized as a result of the selective oxidation process 200, thereby resulting in the formation of a uniform interface between the self-aligned bottom insulating spacers 140 and the lower portions of the vertical semiconductor fins 120. In addition, because of the selectivity of the oxidation process 200, there is no, or an insignificant amount, of oxidation of the semiconductor material at the lower portion of the vertical semiconductor fins 120 adjacent to the self-aligned bottom insulating spacers 140.

Figure 12:
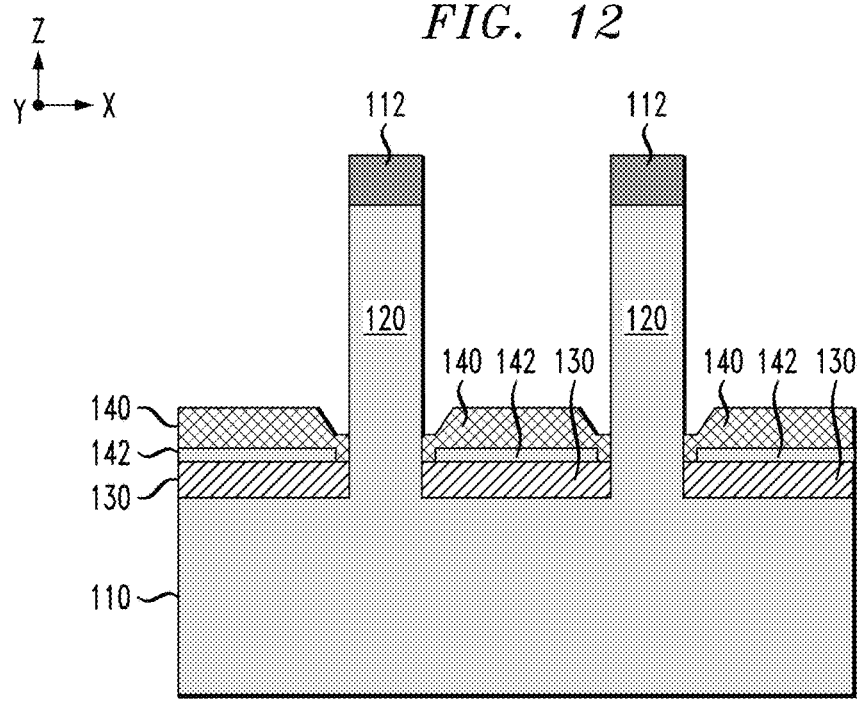

Next, FIG. 12 is a schematic cross-sectional side view of the semiconductor structure of FIG. 11 after removing the sidewall spacers 125 from the vertical semiconductor fins 120. In one embodiment, the sidewall spacers 125 are etched using an isotropic etch process (e.g., dry or wet etch) having an etch chemistry which is configured to etch the material (e.g., SiN) of the sidewall spacers 125 selective to the material (e.g., SiO2) of the self-aligned bottom insulating spacers 140. Following the formation of the intermediate structure shown in FIG. 12, any suitable sequence of FEOL process modules may be implemented to form the gate structures 150, the upper insulating spacers 160, and the ILD layer 170, as shown in FIG. 13.

Figure 13:
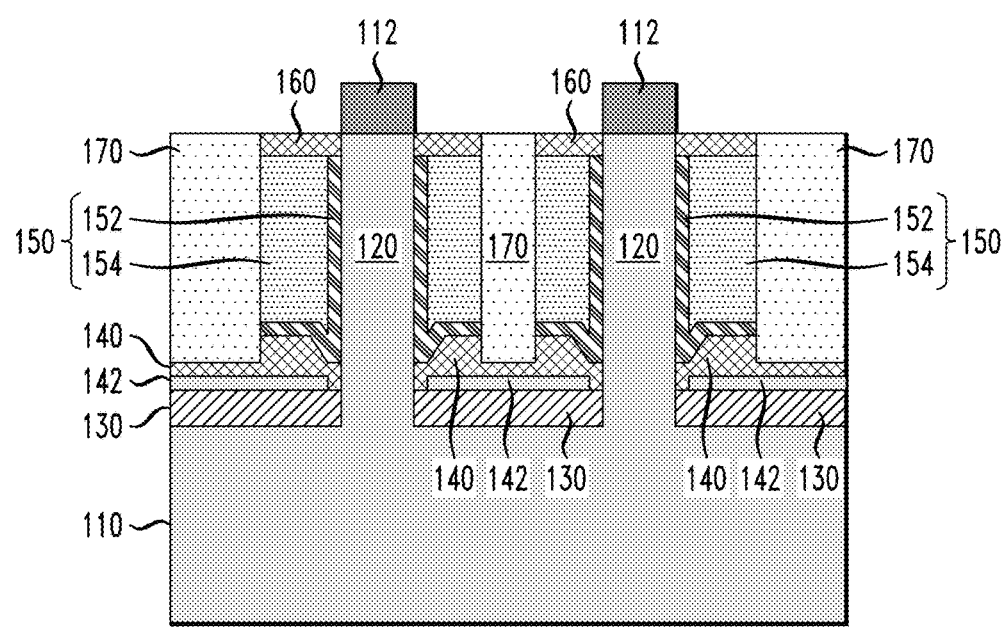

In particular, FIG. 13 is a schematic cross-sectional side view of the semiconductor structure of FIG. 12 after forming the gate structures 150, the upper insulating spacers 160, and the ILD layer 170. For example, the gate structures 150 are formed by depositing one or more conformal layers of gate dielectric material (which form the gate dielectric layer 152) over the surface of the semiconductor structure of FIG. 12. The gate dielectric material may comprise, e.g., nitride, oxynitride, or oxide or a high-k dielectric material having a dielectric constant of about 3.9 or greater. In particular, the conformal layer of gate dielectric material can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The high-k gate dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The conformal layer of gate dielectric material 152 is deposited using known methods such as ALD, for example, which allows for high conformality of the gate dielectric material.

Next, a layer of conductive material (which forms the gate electrode layer 154) is deposited and planarized down to an upper surface of the etch hardmask 112, which essentially removes the overburden gate dielectric material and conductive material that is disposed above the upper surfaces of the etch hardmask 112. The layer of conductive material (which forms the gate electrode layer 154) is formed by depositing a conductive material including, but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

In another embodiment, a thin conformal layer of work function metal (WFM) may be deposited over the conformal layer of gate dielectric material prior to depositing the layer of conductive material. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material that forms the gate electrode layer 154 can serve as a WFM layer.

Following the planarizing process, the layer of conductive material is recessed down to a target depth to form the gate electrode layer 154, wherein the recessed thickness defines a gate length (Lg) of the vertical FET devices. The gate recess can be performed using well known etch-back/recess techniques in which a timed etch process is performed to etch the layer of conductive material down to a target recess level to form the gate electrode layer 154. Following the recess process, the exposed portions of the gate dielectric material on the upper portions of the vertical semiconductor fins 120 are removed, thereby forming the gate structures 150 shown in FIG. 13. The exposed portions of the gate dielectric material can be etched using a dry or wet etch process which is selective to the materials of the vertical semiconductor fins, 120, the gate electrode layer 154, and the etch hardmask 112.

A next step in the fabrication process includes forming the upper insulating spacers 160 on the upper surface of the gate structures 150. In one embodiment, the upper insulating spacers 160 are formed by depositing a layer of insulating material such as silicon oxide, or other types of insulating materials (e.g., low-k dielectric materials) such as SiN, SiBCN or SiOCN. The upper insulating spacers 160 may be formed using a directional deposition process in which the dielectric/insulating material is directly deposited on lateral surfaces, or by blanket depositing the dielectric/insulating material followed by planarizing and recessing the dielectric/insulating material, using well-known deposition and etching techniques.

Following formation of the upper insulating spacers 160, the PMD layer 170 can be formed by etching trench openings through the stack of layers 160, 154, 152, and into portions of the self-aligned bottom insulating spacers 140, and then filling the trench openings with insulating material to form the ILD layer 170. This process serves to form separate gate structures 150 that surround the respective vertical semiconductor fin 120, and which are electrically insulated from each other via the ILD layer 170.

Figure 14:
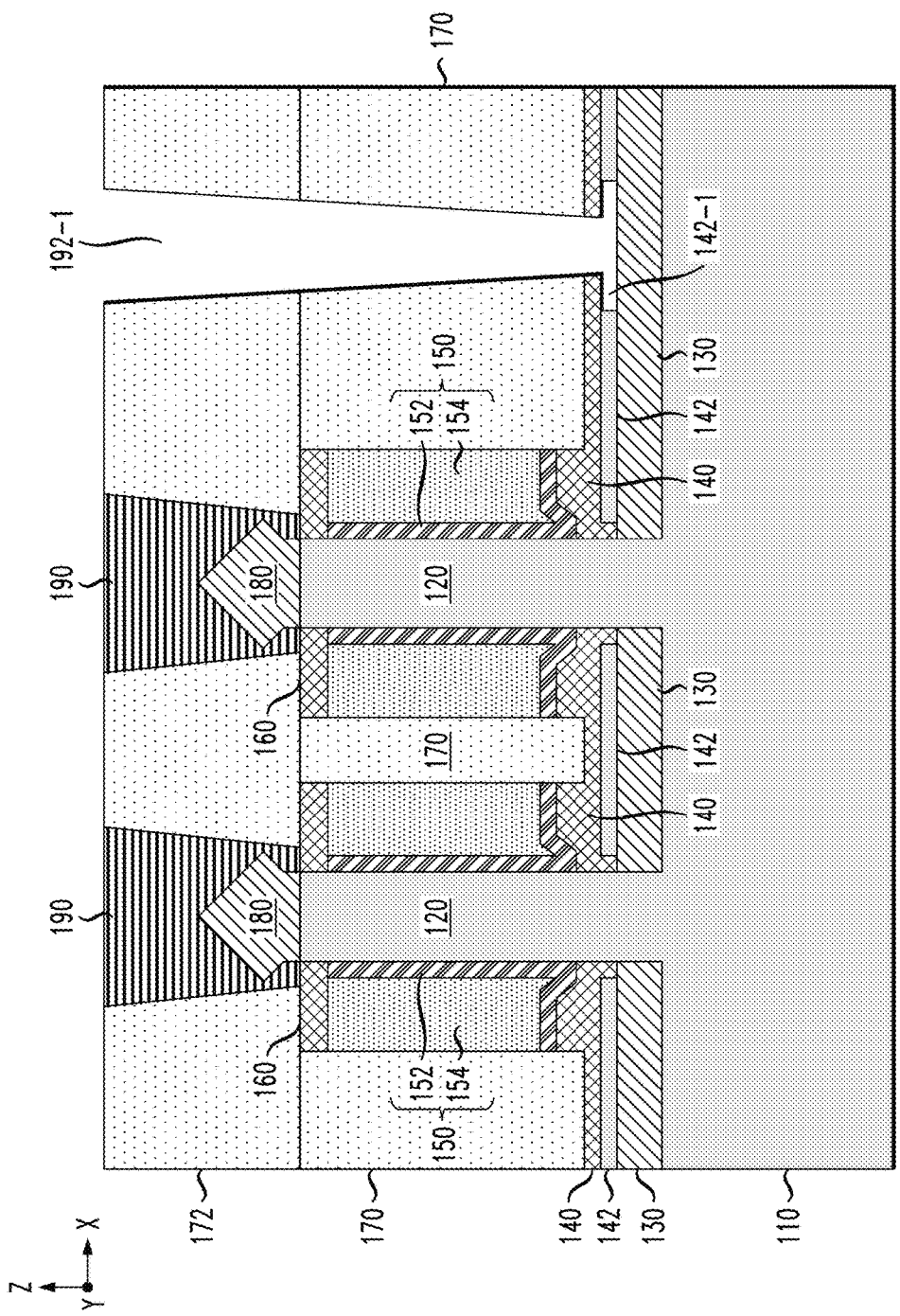

FIG. 14 is a schematic cross-sectional side view of the semiconductor structure of FIG. 13 after forming the upper source/drain regions 180, the ILD layer 172, the vertical source/drain contacts 190, and contact openings 192-1 and 142-1 for a vertical source source/drain contact to the lower source/drain region 130. The upper source/drain regions 180 are formed by epitaxially growing doped epitaxial semiconductor layers (e.g., doped Si or SiGe layers) on the exposed upper portions of the vertical semiconductor fins 120 using known selective epitaxial growth techniques. In one embodiment as shown in FIG. 14, the upper source/drain regions 180 comprise diamond-shaped (or faceted) source/drain structures, which can be formed using known techniques in which the process conditions are adjusted to vary the growth rate on surfaces with different crystallographic orientations, as is known in the art.

Following formation of the upper source/drain contacts 180, a layer of insulating material is deposited and planarized to form the ILD layer 172. The ILD layer 172 and the PMD layer 170 are then patterned to form openings down to the upper source/drain regions 180, and openings down to the landing areas on the gate structures 150 (not shown). The openings are then filed with conductive material to form the vertical source/drain contacts 190 in contact with the upper source/drain region 180, and vertical gate contacts (not shown) in contact with the gate structures 150. The vertical source/drain contact 192 (FIG. 1) to the lower source/drain region 130 can be fabricated by forming the contact opening 192-1 through the ILD layer 172, the PMD layer 170, and the bottom insulating spacer 140 to expose a portion of the high-concentration germanium semiconductor layer 142. The exposed portion of the high-concentration germanium semiconductor layer 142 is then etched selective to the lower bottom insulating spacer 140 and the lower source/drain region 130 to form a lateral opening 142-1 in the high-concentration germanium semiconductor layer 142 between the bottom insulating spacer 140 and the lower source/drain region 130.

In one embodiment, the high-concentration germanium semiconductor layer 142 can be selectively etched (with high etch selectivity) using a gas phase HCl (hydrochloric acid) or wet etch solution to laterally etch the high-concentration germanium semiconductor layer 142 and form the lateral (undercut) etched region 142-1 underneath the self-aligned bottom insulating spacer 140. The gas phase HCl (hydrochloric acid) provides high etch selectivity when, for example, the lower source/drain region 130 is formed of Si or SiGe with a lower Ge concentration. The vertical opening 192-1 and the lateral opening 142-1 are then filled with a metallic material using known techniques to form the vertical source/drain contact 192 with the extended bottom contact element 192-1, as shown in FIG. 1.

Following the formation of the semiconductor structure shown in FIG. 1, any known sequence of processing steps can be implemented to complete the fabrication the semiconductor device including, for example, a BEOL process to form a BEOL interconnect structure which provides connections to/between the vertical FET devices and other active or passive devices that are formed as part of the FEOL layer.

Figure 15:
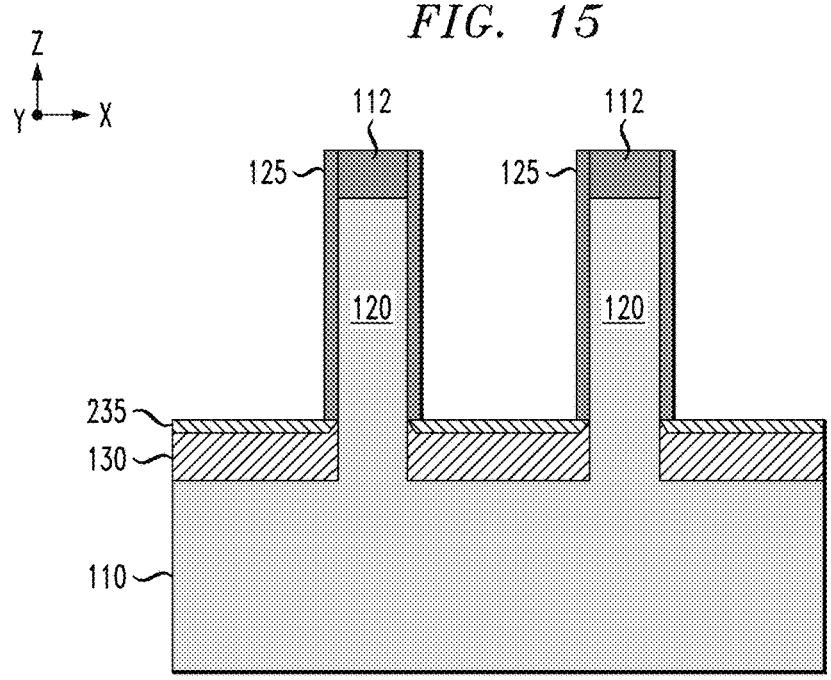
Figure 16:
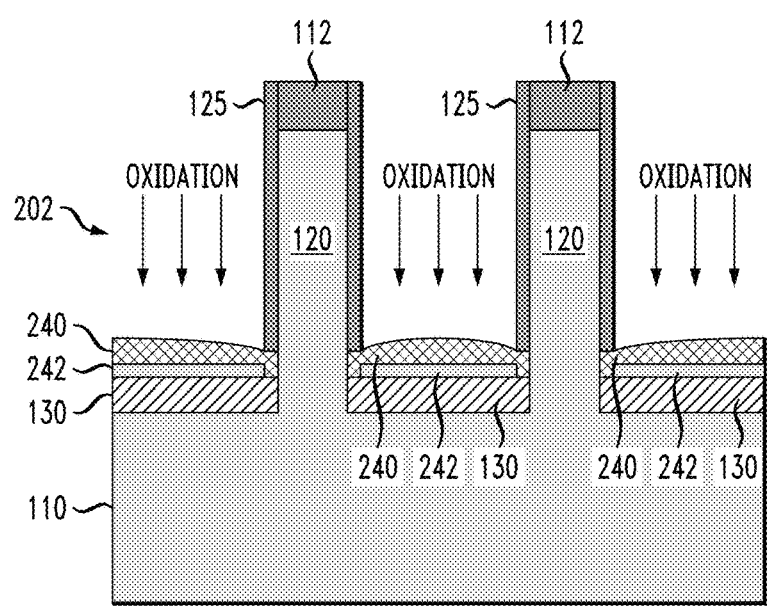

FIGS. 15 and 16 schematically illustrate a process flow for fabricating self-aligned bottom insulating spacers for vertical FET devices according to another embodiment of the invention. In particular, FIGS. 15 and 16 illustrate an alternate embodiment of the process flow described above with referent to FIGS. 10 and 11. In particular, FIG. 15 is a schematic cross-sectional side view of the semiconductor structure of FIG. 9 after forming sacrificial epitaxial semiconductor layers 235 on top of the lower source/drain regions 130, and FIG. 16 is a schematic cross-sectional side view of the semiconductor structure of FIG. 15 showing an oxidation process 202 that is performed to oxidize the sacrificial epitaxial semiconductor layers 235 and form self-aligned bottom insulating spacers 240. The process flow of FIGS. 15 and 16 is similar to the process flow of FIGS. 10 and 11, except that the sacrificial epitaxial semiconductor layers 235 are formed with a thinner profile as compared to the sacrificial epitaxial semiconductor layers 135 shown in FIG. 10. The process flow following the formation of the intermediate semiconductor structure shown in FIG. 16 is the same or similar to the process flow discussed above with reference to FIGS. 12-14, for example.

It is to be understood that the methods discussed herein for fabricating vertical FET devices with self-aligned bottom insulating spacers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
    forming a semiconductor fin on a surface of a semiconductor substrate;
    epitaxially growing a lower source/drain region on the surface of the semiconductor substrate in contact with a bottom portion of the semiconductor fin, wherein the lower source/drain region is formed of a first type of epitaxial semiconductor material;
    epitaxially growing a sacrificial epitaxial semiconductor layer on top of the lower source/drain region, wherein the sacrificial epitaxial semiconductor layer is formed of a second type of epitaxial semiconductor material which is different from the first type of epitaxial semiconductor material;
    selectively oxidizing the sacrificial epitaxial semiconductor layer to form a self-aligned bottom insulating spacer comprising an oxide layer; and
    forming a gate structure in contact with sidewalls of the semiconductor fin;
    wherein the self-aligned bottom insulating spacer electrically insulates the gate structure from the lower source/drain region; and
    wherein the first type of epitaxial semiconductor material comprises crystalline silicon germanium with a first concentration of germanium, and wherein the second type of epitaxial semiconductor material comprises crystalline silicon germanium with a second concentration of germanium which is greater than the first concentration of germanium.

2. A method for fabricating a semiconductor device, comprising:

forming a semiconductor fin on a surface of a semiconductor substrate;
epitaxially growing a lower source/drain region on the surface of the semiconductor substrate in contact with a bottom portion of the semiconductor fin, wherein the lower source/drain region is formed of a first type of epitaxial semiconductor material;
epitaxially growing a sacrificial epitaxial semiconductor layer on top of the lower source/drain region, wherein the sacrificial epitaxial semiconductor layer is formed of a second type of epitaxial semiconductor material which is different from the first type of epitaxial semiconductor material;
selectively oxidizing the sacrificial epitaxial semiconductor layer to form a self-aligned bottom insulating spacer comprising an oxide layer;
forming a gate structure in contact with sidewalls of the semiconductor fin;
wherein the self-aligned bottom insulating spacer electrically insulates the gate structure from the lower source/drain region; and
forming a high-concentration germanium semiconductor layer between the oxide layer and the lower source/drain region, wherein the high-concentration germanium semiconductor layer is formed as a result of the selective oxidation process which pushes germanium atoms in the sacrificial epitaxial semiconductor layer towards the lower source/drain region.

3. The method of claim 1, wherein the oxide layer comprises a silicon oxide layer which is formed by selectively oxidizing the second type of epitaxial semiconductor material using one of a radical oxidation process and a low temperature thermal oxidation process.

4. The method of claim 2, wherein the first type of epitaxial semiconductor material comprises crystalline silicon, and wherein the second type of epitaxial semiconductor material comprises crystalline silicon germanium.

5. The method of claim 2, further comprising:
forming an opening in a portion of the self-aligned bottom insulating spacer to expose a portion of the high-concentration germanium semiconductor layer;
etching the exposed portion of the high-concentration germanium semiconductor layer selective to the self-aligned bottom insulating spacer and the lower source/drain region to form a lateral opening in the high-concentration germanium semiconductor layer between the self-aligned bottom insulating spacer and the lower source/drain region; and
filling the lateral opening with a conductive material to form lower contact element of a vertical source/drain contact in contact with the lower source/drain region.

6. The method of claim 1, further comprising:
forming an upper insulating spacer on the gate structure; and
forming an upper source/drain region on an upper portion of the semiconductor fin;
wherein the upper insulating spacer electrically insulates the gate structure from the upper source/drain region.

7. The method of claim 1, wherein the gate structure comprises a high-k gate dielectric layer and a metallic gate electrode layer.

8. A method for fabricating a semiconductor device, comprising:
patterning a surface of a semiconductor substrate to form a semiconductor fin;
forming sidewall spacers on sidewalls of the semiconductor fin;
recessing the surface of the semiconductor substrate to a target depth below a bottom level of the sidewall spacers to form an extended bottom portion of the semiconductor fin;
laterally etching exposed sidewalls of the extended bottom portion of the semiconductor fin to reduce a width of the extended bottom portion of the semiconductor fin;
epitaxially growing a lower source/drain region on the recessed surface of the semiconductor substrate in contact with the extended bottom portion of the semiconductor fin, wherein the lower source/drain region is formed of a first type of epitaxial semiconductor material;
epitaxially growing a sacrificial epitaxial semiconductor layer on top of the lower source/drain region, wherein the sacrificial epitaxial semiconductor layer is formed of a second type of epitaxial semiconductor material which is different from the first type of epitaxial semiconductor material;
selectively oxidizing the sacrificial epitaxial semiconductor layer to form a self-aligned bottom insulating spacer comprising an oxide layer;
removing the sidewall spacers from the sidewalls of the semiconductor fin; and
forming a gate structure in contact with the sidewalls of the semiconductor fin;
wherein the self-aligned bottom insulating spacer electrically insulates the gate structure from the lower source/drain region.

9. The method of claim 8, wherein the lower source/drain region is formed with a thickness such that an upper surface of the lower source/drain region is disposed below the bottom level of the sidewall spacers, and wherein the sacrificial epitaxial semiconductor layer is formed with a thickness such that an upper surface the sacrificial epitaxial semiconductor layer is disposed above the bottom level of the sidewall spacers.

10. The method of claim 8, wherein the first type of epitaxial semiconductor material comprises crystalline silicon, and wherein the second type of epitaxial semiconductor material comprises crystalline silicon germanium.

11. The method of claim 8, wherein the first type of epitaxial semiconductor material comprises crystalline silicon germanium with a first concentration of germanium, and wherein the second type of epitaxial semiconductor material comprises crystalline silicon germanium with a second concentration of germanium which is greater than the first concentration of germanium.

12. The method of claim 8, wherein the oxide layer comprises a silicon oxide layer which is formed by selectively oxidizing the second type of epitaxial semiconductor material using one of a radical oxidation process and a low temperature thermal oxidation process.

13. The method of claim 8, further comprising forming a high-concentration germanium semiconductor layer between the oxide layer and the lower source/drain region, wherein the high-concentration germanium semiconductor layer is formed as a result of the selective oxidation process which pushes germanium atoms in the sacrificial epitaxial semiconductor layer towards the lower source/drain region.

14. The method of claim 13, further comprising:
forming an opening in a portion of the self-aligned bottom insulating spacer to expose a portion of the high-concentration germanium semiconductor layer;
etching the exposed portion of the high-concentration germanium semiconductor layer selective to the self-aligned bottom insulating spacer and the lower source/drain region to form a lateral opening in the high-concentration germanium semiconductor layer between the self-aligned bottom insulating spacer and the lower source/drain region; and filling the lateral opening with a conductive material to form lower contact element of a vertical source/drain contact in contact with the lower source/drain region.

15. The method of claim 8, further comprising:

forming an upper insulating spacer on the gate structure; and forming an upper source/drain region on an upper portion of the semiconductor fin;

wherein the upper insulating spacer electrically insulates the gate structure from the upper source/drain region.

16. A semiconductor device, comprising:

a vertical field effect transistor (FET) device on a semiconductor substrate, wherein the vertical FET device comprises:

a semiconductor fin formed on a recessed surface of a semiconductor substrate;

a lower source/drain region formed on the recessed surface of the semiconductor substrate in contact with a bottom portion of the semiconductor fin, wherein the lower source/drain region comprises a first type of epitaxial semiconductor material;

a self-aligned bottom insulating spacer formed on the lower source/drain region, the self-aligned bottom insulating spacer comprising an oxide layer formed from oxidation of a second type of epitaxial semiconductor material epitaxially grown on the lower source/drain region, which is different from the first type of epitaxial semiconductor material;

a gate structure formed in contact with sidewalls of the semiconductor fin;

an upper insulating spacer formed on the gate structure;

an upper source/drain region formed on an upper portion of the semiconductor fin; and a high-concentration germanium semiconductor layer disposed between the oxide layer of the self-aligned bottom insulating spacer and the lower source/drain region;

wherein the self-aligned bottom insulating spacer electrically insulates the lower source/drain region from the gate structure; and wherein the upper insulating spacer electrically insulates the upper source/drain region from the gate structure.

17. The semiconductor device of claim 16, wherein the first type of epitaxial semiconductor material comprises crystalline silicon, and wherein the second type of epitaxial semiconductor material comprises crystalline silicon germanium.

18. A semiconductor device, comprising:

a vertical field effect transistor (FET) device on a semiconductor substrate, wherein the vertical FET device comprises:

a semiconductor fin formed on a recessed surface of a semiconductor substrate;

a lower source/drain region formed on the recessed surface of the semiconductor substrate in contact with a bottom portion of the semiconductor fin, wherein the lower source/drain region comprises a first type of epitaxial semiconductor material;

a self-aligned bottom insulating spacer formed on the lower source/drain region, the self-aligned bottom insulating spacer comprising an oxide layer formed from oxidation of a second type of epitaxial semiconductor material epitaxially grown on the lower source/drain region, which is different from the first type of epitaxial semiconductor material;

a gate structure formed in contact with sidewalls of the semiconductor fin;

an upper insulating spacer formed on the gate structure; and an upper source/drain region formed on an upper portion of the semiconductor fin;

wherein the self-aligned bottom insulating spacer electrically insulates the lower source/drain region from the gate structure;

wherein the upper insulating spacer electrically insulates the upper source/drain region from the gate structure; and wherein the first type of epitaxial semiconductor material comprises crystalline silicon germanium with a first concentration of germanium, and wherein the second type of epitaxial semiconductor material comprises crystalline silicon germanium with a second concentration of germanium that is greater than the first concentration of germanium.

19. The method of claim 2, wherein the first type of epitaxial semiconductor material comprises crystalline silicon germanium with a first concentration of germanium, and wherein the second type of epitaxial semiconductor material comprises crystalline silicon germanium with a second concentration of germanium which is greater than the first concentration of germanium.

20. The device of claim 16, wherein the first type of epitaxial semiconductor material comprises crystalline silicon germanium with a first concentration of germanium, and wherein the second type of epitaxial semiconductor material comprises crystalline silicon germanium with a second concentration of germanium which is greater than the first concentration of germanium.

* * * * *